United States Patent [19]

Heuber et al.

[11] 4,259,730
[45] Mar. 31, 1981

[54] IIL WITH PARTIALLY SPACED COLLARS

[75] Inventors: Klaus Heuber, Boeblingen; Erich Klink, Schoenaich; Volker Rudolph, Aidlingen, all of Fed. Rep. of Germany; Siegfried K. Wiedmann, Peekskill, N.Y.

[73] Assignee: International Business Machines Corporation, Armonk, N.Y.

[21] Appl. No.: 27,223

[22] Filed: Apr. 5, 1979

[30] Foreign Application Priority Data

Apr. 19, 1978 [DE]  Fed. Rep. of Germany ....... 2816949

[51] Int. Cl.$^3$ .................. H01L 27/04; G11C 11/40; H03K 19/091
[52] U.S. Cl. .................................. 365/156; 357/50; 357/89; 357/20; 357/92
[58] Field of Search .................. 357/44, 46, 92, 20, 357/50, 89; 307/238; 365/154, 156, 155, 181

[56] References Cited

U.S. PATENT DOCUMENTS

| 4,021,786 | 5/1977 | Peterson | 357/92 |
| 4,056,810 | 11/1977 | Hart et al. | 357/92 |
| 4,112,511 | 9/1978 | Heald | 357/92 |
| 4,137,109 | 1/1979 | Aiken et al. | 357/92 |
| 4,183,037 | 1/1980 | Le Can et al. | 357/92 |

FOREIGN PATENT DOCUMENTS 2612666 9/1977 Fed. Rep. of Germany ............ 357/92

OTHER PUBLICATIONS

Wiedmann, IBM Tech Discl., Bulletin, vol. 21, No. 1, Jun. 1978, pp. 231-232.

Primary Examiner—William D. Larkins
Attorney, Agent, or Firm—Stephen J. Limanek

[57] ABSTRACT

The invention relates to a monolithically integrated semiconductor arrangement with at least one integrated injection logic (I$^2$L) structure including an injection zone and an inverting transistor, the injection zone, and lateral thereto, the transistor base zone of a same first conductivity type being arranged in a semiconductor layer of a second conductivity type, which forms the emitter zone of the transistor, the transistor being completed by a collector zone of the second conductivity type, which is formed in the base zone, and the I$^2$L structure being surrounded at least partly by a separating zone introduced at a predetermined spacing into the semiconductor layer. The injection zone and the transistor base zone in the region of their edges facing each other are extended up to or into the separating zone, while in the region of their remaining edges they are spaced therefrom at the predetermined distance. The invention further relates to a storage arrangement having storage cells including two such I$^2$L structures each which are cross-coupled in the manner of a flip-flop.

10 Claims, 8 Drawing Figures

IIL WITH PARTIALLY SPACED COLLARS

DESCRIPTION

1. Technical Field

The invention relates to highly integrated, inverting logic and memory circuits having a zone sequence forming an inverting transistor which is supplied with power by charge carrier injection via an injection region close to the base-emitter junction and which is controlled on the base.

2. Background Art

The field of logical circuits with bipolar transistors has been marked by considerable progress in recent years, which has attracted the attention of the experts and which under the term Merged Transistor Logic (MTL) or Integrated Injection Logic (I²L) has been referred to extensively in technical literature. Attention is drawn, for example, to the article in the *IEEE Journal of Solid-State Circuits*, Vol. SC-7, No. 5, October 1972, pp. 340 to 346. Relevant patents are, for example, commonly assigned U.S. Pat. Nos. 3,736,477 and 3,816,758. This injection logic concept is essentially based on inverting single- or multiple-collector transistors which are fed close to (order of magnitude of one diffusion length) their emitter-base junctions by the injection of minority charge carriers inside the semiconductor body.

This bipolar logic concept is marked by short switching times. In addition, it is suitable for realizing extremely highly integrated large-scale logical circuits with a great number of logical elements which can be manufactured on a single semiconductor chip. For the manufacture of logical circuits in highly integrated technology, essentially three prerequisites have to be fulfilled. The basic circuits must be as simple and space-saving as possible, so that as great a number of them as possible can be arranged on a single semiconductor chip. In addition, the layout of the circuits must be such that an adequate speed does not lead to an excessive increase in power dissipation on the semiconductor chip, which is tantamount to the requirement that the product of the factors delay time and power dissipation per logical function should be as small as possible. Finally, to obtain a good yield and thus for economical as well as technological reasons, the manufacturing process required must be as simple and readily applicable as possible. All these factors are generally taken into account by the logic concept described, in particular in comparison with other existing logic concepts, e.g., transistor-transistor logic, T²L.

A basic structure of this logic concept, as described in the aforementioned U.S. Patents, includes a semiconductor layer of a first conductivity type zone with a second conductivity type serving as emitter and collector zones of a lateral transistor structure arranged spaced from each other. In the collector zone of the lateral transistor structure at least one further zone of opposite or first conductivity type is arranged which serves as the collector zone of an inversely operated vertical, complementary transistor structure. The collector zone of the lateral transistor structure simultaneously forms the base zone of the vertical transistor structure. The base zone of the lateral and the emitter zone of the inversely operated vertical transistor structure are formed by the semiconductor layer of the first conductivity type. For operating this semiconductor structure as a logical basic circuit, a load-independent current is impressed into the emitter zone of the lateral transistor structure, which as a function of the input signal applied to the collector zone of the lateral and the base zone of the vertical transistor controls the current supplying the inverted output signal through the vertical transistor structure. By merging the zones of the same doping and connected to the same potential, a structure of optimum integration is obtained, the manufacture of which requires only two diffusion processes in the embodiment considered.

Other known examples of this basic circuit include a layer structure with four zones of different conductivity types, which comprise two vertical, monolithically merged transistor structures and which are suitably operated. In this case minority charge carriers are also injected via the emitter zone of one transistor, which causes current to be supplied to the basic circuit, while the output signal is supplied via the other transistor structure.

By suitably combining such inverting logical basic circuits, desired logical circuits can be realized.

For determining the conductive and switching state, respectively, of individual inverting transistors of the basic circuits as a result of a logical operation, suitable sense circuits are connected to the signal path. These sense circuits generally subject the signal paths to a load, thus causing additional undesired switching time delays. Therefore, the question arises how such loads on the signal path can be largely reduced.

The inverting, logical base circuits described are most suitable for the design of logical circuits and are equally suitable as components for monolithically integrated storage cells. Such storage cells are used in particular in digital data processing systems. The storage cells are arranged in a matrix, so that via corresponding selection means each cell can be addressed, while data is written into or read from it.

It is known that inverting logical circuits require two stages to obtain storage cells in the manner of bistable multivibrators and flip-flops, respectively. Thus, a storage cell includes two such basic circuits which are symmetrically designed and whereby the output of one circuit is connected to the input of the other to provide a feedback condition. In this manner the necessary cross-coupling, as exists in the usual flip-flops, is obtained.

From commonly assigned U.S. Pat. No. 3,815,106, "Flip-Flop Memory Cell Arrangement" by Siegfried K. Wiedmann, issued June 4, 1974, a storage cell is known which includes two of the logical basic circuits described and in which the collector of the inverting transistor of one basic circuit is in each case connected to the base of the inverting transistor of the other basic circuit. The two inverting transistors are inversely operated, forming the actual flip-flop transistors. The complementary transistor of each basic circuit, via which the injection of minority charge carriers and thus the power supply is effected and which is connected via a separate line, serves as the load element for both flip-flop transistors. For the purpose of addressing, that is means for writing into and reading from the storage cell, the base of each flip-flop transistor is additionally connected to the emitter of an associated additional addressing transistor which is also complementary and whose collector is connected to the associated bit line, and whose base is connected to the address line. In addition to the injecting transistor forming the load element, a further addressing transistor is necessary which is formed by a lateral transistor structure.

By laterally arranging the two circuits to form one storage cell and by merging the zones connected to the same potential, a desired simple semiconductor structure is obtained. By means of this known storage cell a storage matrix can be realized in which the storage cells are arranged in at least two horizontal rows and at least four vertical columns. A first vertical address line is associated with the first and the second columns and a second vertical address line with the third and the fourth columns. Furthermore, a first horizontal address line is associated with the first row and a second horizontal address line with the second row. Finally, a first bit line pair is associated with the first column, a second bit line pair with the second and the third columns, and a third bit line pair with the fourth column. Each bit line pair extends preferably in a vertical direction between the associated columns.

The bit lines are in each case connected to the collectors of the addressing transistors, the first address line is connected to the emitters of the transistors forming the load elements, and the second addressing line is connected to the bases of the addressing transistors.

Proceeding from the known inverting logical basic circuit, commonly assigned patent application Ser. No. 763,183, entitled, "Highly Integrated Inverting Circuit" by Siegfried K. Wiedmann, filed Jan. 27, 1977, now abandoned, relates to a correspondingly improved basic circuit which particularly because of its operation offers considerable advantages in connection with logical circuits and which by means of sense circuits largely reduces the load imposed on the actual signal path. This is accomplished by sensing the conductive state of the inverting transistor of the basic $I^2L$ circuit with the aid of a sense circuit incorporated in the injection current circuit and thus in the operating current circuit. This sensing is effected as a function of the current reinjected into the injection zone with a conductive inverting transistor. When this principle is used in a circuit including two such circuits connected in the form of a flip-flop to serve as a storage cell, both the supply of the operating current and the coupling of the read/write signals is effected via bit lines connected to the injection zone. In this manner no separate addressing transistors are required, and the additional injection zone required with the known storage cell is eliminated. Certain problems may be encountered when the $I^2L$ basic circuit proposed in the aforementioned patent application and the storage cell produced with its aid are realized if importance is attached to minimum dimensions for the structure and thus to maximum integration density. These minimum dimensions, i.e., the minimum area requirement obtainable for and $I^2L$ basic circuit are, for technological reasons, essentially a function of the minimum dimensions obtainable for the contact and diffusion windows in the photolithographic masking processes used during manufacture.

Thus, the injection zone and the base zone of the inverting transistor, which is introduced lateral to the injection zone into the common semiconductor layer, are by necessity subject to minimum dimensions. Proceeding from the technologically unavoidable minimum dimensions of these zones, it is necessary with most applications of the basic circuit to separate the semiconductor structure from adjacent integrated structures by means of a separating zone introduced into the common semiconductor layer at a particular spacing. This separating zone serves to prevent parasitic lateral minority charge carrier injections from the injection zone and from the base zone of the inverting transistor, which lead to undesirable charge storage effects and to parasitic transistor effects in connection with adjacent zones and which may thus obviously negatively influence the function of the structure. For the topological layout of the structure, care is to be taken that a minimum value is observed for the distance between the separating zone and the injection and base zones, to reduce parasitic capacitances which may occur between injection and base zones on the one hand and the separating zone on the other. An $I^2L$ structure manufactured in accordance with the ground rules determined by the technology applied and aimed at minimum area requirements is characterized in that the facing injecting and reinjecting edges of the injection zone forming the lateral transistor zone and of the base zone of the inverting transistor are of the shortest possible length. This edge length determines the efficiency of the injection and the reinjection of minority charge carriers. In other words, this edge length determines the current amplification of the lateral transistor in the forward and the backward direction.

For many applications of the $I^2L$ basic circuit, in particular those using the basic circuit in the form of storage cells designed in the manner of a flip-flop, these current amplifications may be too low, to obtain reliably operating circuits.

This becomes apparent from the fact that in particular during the sensing of the conductive state of the inverting transistor the signal supplied on the injection zone as a result of charge carriers being reinjected by the conductive transistor may be too weak to provide a clearly defined read signal for storage cells.

DISCLOSURE OF THE INVENTION

It is an object of this invention to provide a semiconductor structure for an $I^2L$ basic circuit and a use of this basic circuit in the form of a storage cell, which, proceeding from process-related minimum dimensions of the individual semiconductor zones, the contact areas and the distance of the required injection-limiting separating zone surrounding the structure, has an increased current amplification of the lateral transistor in the forward and the backward direction over that of corresponding known $I^2L$ basic circuits, without having to tolerate an increased parasitic capacitance with regard to the separating zone.

In accordance with the invention, this problem is solved in that proceeding from fixed lateral minimum dimensions, the injection zone and the base zone in the region of their edges facing each other are extended up to or into the separating zone, while in the region of their remaining edges they are spaced therefrom at the predetermined distance.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1A:
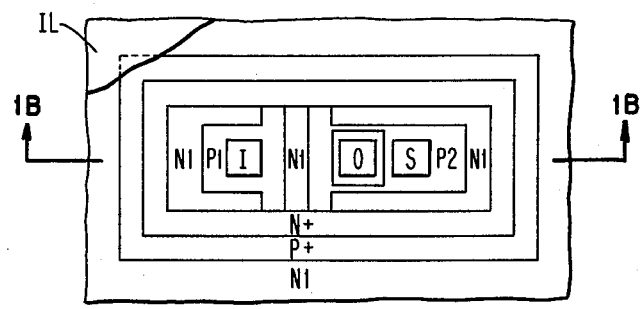
FIG. 1A is a plan view of an integrated semiconductor arrangement with an $I^2L$ structure in accordance with the invention.
Figure 1B:
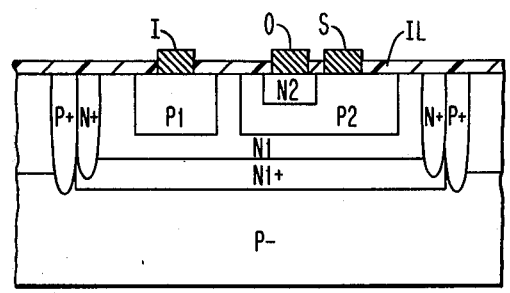
FIG. 1B is a sectional view of the $I^2L$ structure in accordance with FIG. 1A taken along line 1B—1B.

The semiconductor structure shown in the plan view of FIG. 1A and the sectional view of FIG. 1B includes the basic structure of the logical I$^2$L basic circuit. The typical layout as well as the operation of the basic structure are described in detail in the aforementioned literature, so that not more than a summarizing description need be given here. The designations of the individual layers and zones are chosen in such a manner that they simultaneously indicate the conductivity type.

As a starting material a lightly doped semiconductor substrate P− of a first conductivity type, for example, of the P conductivity type, is used. On the semiconductor substrate a heavily doped buried zone N1+ of the opposite conductivity type is arranged. On top of the buried zone N1+, an N doped epitaxially applied semiconductor layer N1 is arranged. Two oppositely doped zones P1 and P2 are introduced at a particular spacing into the semiconductor layer N1. Zone P2 has formed therein a further oppositely doped zone N2. This structure is surrounded by a heavily doped ring zone N+ of the conductivity type of the semiconductor layer N1. This ring zone serves as a separating zone which prevents an undesired lateral injection of minority charge carriers. As shown in the example considered, this separating zone N+ can extend through the full semiconductor layer N1 into the buried zone N1+. In certain circumstances the injection-limiting effect of this separating zone, if it extends only through part of the semiconductor layer N1, may be sufficient. If the structure is to be electrically isolated against adjacent structures, the separating zone N+ is surrounded by a heavily doped isolation zone P+ of the conductivity type of the semiconductor substrate. Isolation is effected by the blocking PN junction formed between the isolation zone P+ and the semiconductor layer N1. The structure is completed by a covering isolation layer IL having contact windows for introducing contacts I, O, and S to the corresponding zones P1, N2, and P2.

The structure described so far in FIGS. 1A and 1B corresponds to known structures. While in the known structures the zones P1 and P2 are essentially rectangularly shaped, the zones of the structure in accordance with this invention, as shown in FIG. 1A, are extended into the separating zone N+ in the region of their edges facing each other, while in the region of their remaining edges, similar to the known structure, they are arranged at a particular spacing from the separating zone N+. The essential feature characterizing the invention, namely, that the zones P1 and P2 in the region of the edges facing each other are extended into the separating zone N+, need not be initially considered to describe the general operation of the basic structure.

Figure 1C:
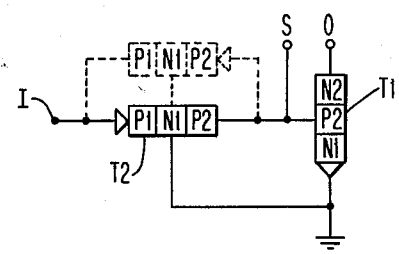
FIG. 1C is an equivalent circuit diagram of the structure in accordance with FIGS. 1A and 1B, indicating the function of the circuit.

The electrical equivalent circuit diagram of the structure described in connection with FIGS. 1A and 1B is shown in FIG. 1C, the identical designation of the individual identical zones permitting a direct comparison between the structure and the equivalent circuit diagram.

Accordingly, the inverting logical basic circuit used in accordance with the invention essentially includes an inverting transistor T1 with the zone sequence N2, P2, N1 which is fed by the direct injection of minority charge carriers. The inverting transistor T1 is designed as an inversely operated, vertical transistor. For the purpose of injecting minority charge carriers, a transistor T2 complementary thereto with the zone sequence P1, N1, P2 is provided, which in the structure considered is laterally designed. Both transistors are jointly integrated at maximum integration by merging common semiconductor zones connected to the same potential. The semiconductor layer N1 simultaneously serves as a base zone of the lateral transistor T2 and as an emitter zone of the vertical transistor T1. The injection zone P1 forms the emitter zone of the lateral transistor T2. The zone P2 simultaneously forms the base zone of the vertical, inverting transistor T1 and the collector zone of the injecting lateral transistor T2. The zone N2 forms the collector zone of the inverting transistor T1. On zone P1, forming the emitter zone of the injecting transistor, an injector terminal I is arranged, via which current is externally applied. This current supplies the operating current for the inverting transistor T1. On zone P2, forming the base zone of this transistor, a control terminal S is provided, as indicated in FIGS. 1A, 1B and 1C, via which the conductive state of the inverting transistor T1 can be switched. On zone N2 the collector terminal O is arranged which is the output of the inverting basic circuit. The conductive state of the inverting transistor T1, which is determined by the control signal on control terminal S, can be sensed via an injection path, that means a sense circuit, not shown, connected to the current supply. For this purpose advantage is taken of the fact that with inverting transistor T1 being conductive, the base zone P2 simultaneously acts as an emitter, reinjecting a current opposite to the normal injection current and supply current, respectively, into the actual injection zone P1 of the lateral transistor T2. Thus, the current flowing across the injection terminal I with inverting transistor T1 being conductive has a lower value than with a blocked transistor, proceeding from the same base-emitter voltage $V_{BE}$. This current difference can be sensed by means of a conventional sense circuit. The fact of reinjection with a conductive transistor T1 is indicated in the equivalent circuit diagram by the parallel transistor structure illustrated by broken lines, in addition to the normal transistor T2. Thus, in the parallel transistor structure the collector and emitter are interchanged. The sense circuit can be designed in such a manner that it detects either the current difference or a corresponding voltage difference. This permits sensing the conductive state of the inverting transistor T1 without additional lines or semiconductor zones being required in the existing basic structure.

If the structure described above is to be designed in such a manner that its minimum area requirements correspond to those obtainable by present technological means, attention is drawn to the following facts.

The minimum area requirements obtainable are governed in the first place by the technology applied. Of particular significance are the photolithographic masking processes and the necessary tolerances during the alignment of subsequent masks. Utilizing all presently known technological means, the lateral dimensions obtainable for the zones P1 and P2 are so small that the injection and reinjection, respectively, of minority charge carriers across the still existing length of the edges of these two zones facing each other is no longer sufficient to ensure the function of the structure and to maintain the injection and reinjection currents, respectively. For this purpose it is to be additionally taken into account that during the manufacturing process, as a result of rounding off effects, the actual effective edge length is reduced further over the theoretically obtainable edge length. In other words, the current amplification of the lateral transistor structure T2 in the forward direction, indicated in FIG. 1C as the solid line transistor structure, and in the backward direction, indicated as the broken line transistor structure, may no longer be sufficient. In particular during the sensing of the conductive state of the inverting transistor T1 via the injector terminal I it will be found that the current or voltage difference as a result of the reinjected current is too low to provide a clearly definable sense signal.

In accordance with the invention, advantage is taken of the fact that the separating zone N+ surrounding the zones P1 and P2 must be arranged at a particular spacing from zones P1 and P2. Such a spacing is necessary to avoid unduly high parasitic capacitances between zones P1 and P2 and the separating zone N+. The essential feature on which the invention is based is that the zones in the region of their edges facing each other, which determine the effective injection and reinjection, are extended into the separating zone N+, while the remaining edge areas are arranged at the predetermined spacing from the separating zone.

In comparison with the known I²L structures, the structure of the invention, in spite of its minimum area requirements, has a maximum edge length for the injecting and reinjecting zones, respectively, without having to tolerate a noticeable increase in the parasitic capacitances. Thus, an optimum current amplification of the lateral transistor is obtained both in the forward and the backward direction, this being tantamount to an increased output signal on terminal O of the inverting transistor T1 and an increased sense and read signal, respectively, on the injector terminal I of the lateral tansistor T2.

Figure 1D:
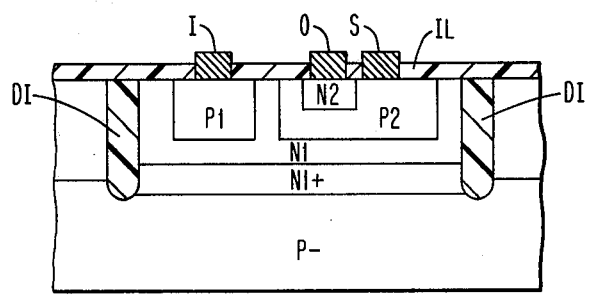
FIG. 1D is a sectional view similar to that of FIG. 1B but indicating a dielectric separating zone.

A variant of the embodiment shown in FIGS. 1A to 1C may include a dielectric isolation zone DI provided in place of the injection-limiting ring zone N+ and the isolation zone P+, as illustrated in FIG. 1D of the drawing.

Figure 2A:
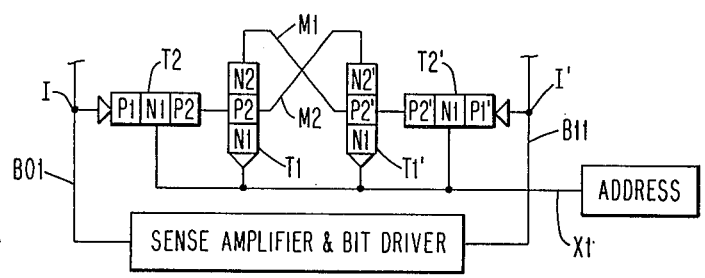
FIG. 2A is an equivalent circuit diagram of a storage cell in accordance with the invention, which is made up of two cross-coupled basic circuits illustrated in FIG. 1C.

Application in all essential points of the inverting basic circuit in accordance with the invention is obtained by combining two basic circuits of FIGS. 1A to 1C in the form of a highly integrated storage cell, as shown in the equivalent circuit diagram of FIG. 2A. The individual semiconductor zones are again provided with the same reference characters as in FIGS. 1A to 1C, whereby the designations of one of the two basic circuits include a line index for ready distinction.

The storage cell is realized in the form of a flip-flop circuit. The two inverting transistors T1 and T1' form the actual flip-flop transistors of the circuit. The collector of the inverting transistor of one basic circuit is connected to the base of the inverting transistor of the other basic circuit. In this manner the necessary mutual feedback of the two inverting basic circuits is obtained. The transistors T2 and T2' of the two basic circuits form in each case the injecting and reinjecting transistor for the associated complementary inverting transistor T1 and T1'. The injector terminal I and I' of each basic circuit is connected to an associated bit line B01 and B11, respectively, of a corresponding bit line pair, which in turn is connected to conventional sense amplifier and bit driver circuitry. The emitters of the two inverting transistors T1 and T1' are connected to a common address line X1, which in turn is connected to conventional address circuitry such as a word driver.

Figure 2B:
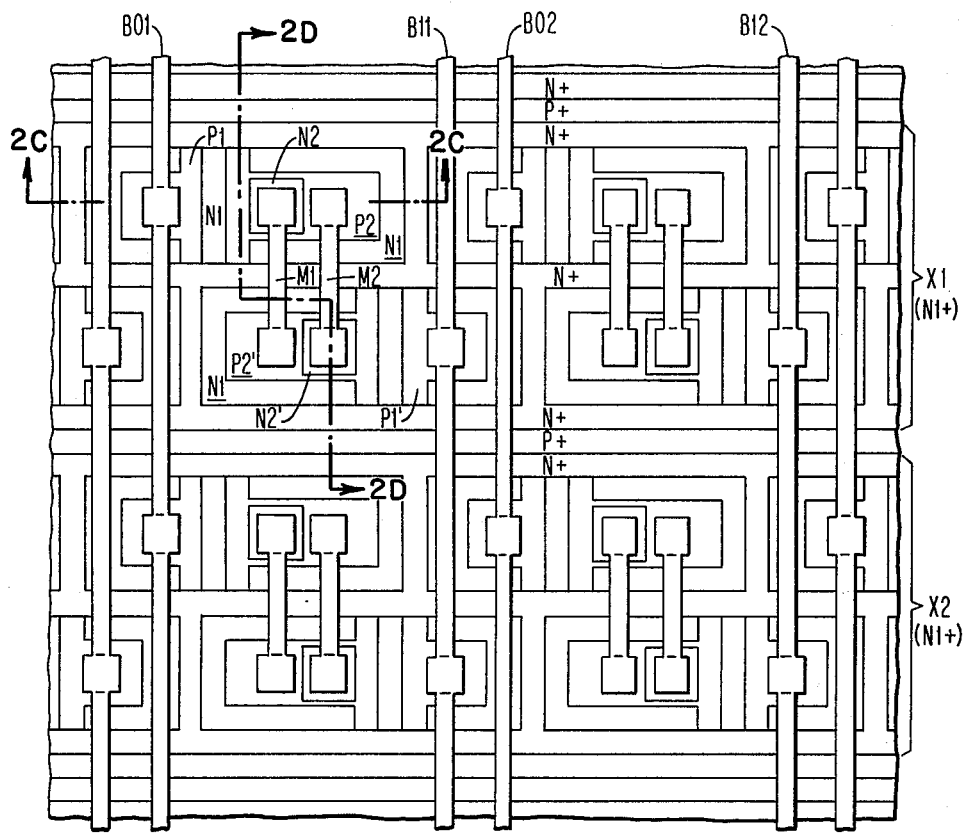
FIG. 2B is a plan view of a section of an integrated storage matrix with storage cells in accordance with the invention.
Figure 2C:
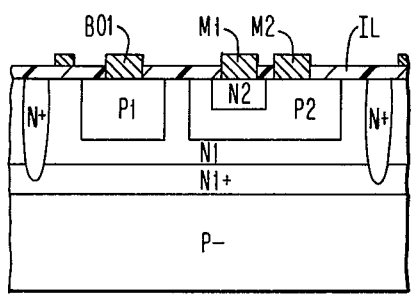
FIGS. 2C and 2D are sectional views of the storage matrix in accordance with FIG. 2B taken along lines 2C—2C and 2D—2D, respectively.
Figure 2D:
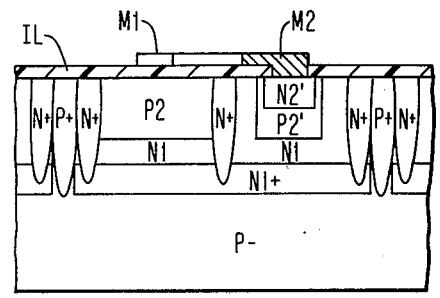

The structural layout of a storage matrix realized by means of such storage cells is shown by way of a plan view in FIG. 2B and by way of partial sectional views in FIGS. 2C and 2D.

FIG. 2B shows a plan view of a portion of a storage matrix comprising four storage cells. The storage cells are arranged in a known manner in rows and columns. Individual lines are electrically isolated against each other by means of isolation zones P+ introduced into the semiconductor layer N1 common to all storage cells. A bit line pair, such as B01-B11 or B02-B12, is associated with each vertical column of storage cells. Each storage cell includes two basic structures with the zones p1, P2, N2 and P1', P2', N2', which are common to all storage cells of the matrix and are introduced into the epitaxial semiconductor layer N1 arranged on a substrate P—. The functions of these basic structures were described hereinabove in connection with FIGS. 1A, 1B and 1C.

All I²L basic structures of a cell are separated from the isolation zones P+ defining the rows and from the respective adjacent I²L basic structure by an injection-limiting separating zone N+. In the considered example the two basic structures forming a storage cell are rotated through 180° in relation to each other. This ensures that the collector zones N2 and N2' of the two inverting transistors T1 and T1' are optimally disposed relative to the active edge of the appertaining base zone p2 and P2', respectively, and that the cross-coupling can be realized in the form of short, parallel conductors M1 and M2.

The essential feature of the storage cell in accordance with the invention is, as previously described in connection with the basic structures of FIGS. 1A, 1B and 1C that the zones P1 and P2 and P1' and P2', respectively, in the region of their injecting and reinjecting edges are extended into the separating zone N+ so that they have a maximum active edge length, proceeding from minimum dimensions selected for the total structure. parasitic capacitances are reduced to a minimum, since these zones in their remaining edge regions are arranged at the required spacing from the separating zone N+.

The bit lines BOX of each pair are connected in each case to the injecting zones P1, and the bit lines B1X are connected to the injecting zones P1' of each storage cell of the associated column. The cross-coupling between the collector zone N2, N2' of one inverting transistor T1, T1' and the base zone P2, P2' of the other inverting transistor includes the previously mentioned conductors M1 and M2 extending across an isolation layer IL. The address line, such as X1 or X2 of each row of storage cells is formed by the heavily doped buried zone N1+ arranged in each row.

It can be seen that the described structure of the storage cell and the whole storage matrix, respectively, has an optimum degree of integration, a simple layout, and can be readily realized.

For the operation of the storage matrix only one bit line pair per column and one address line X in the form of a buried zone N1+ per row are selected. The operation of a storage cell in accordance with the invention will be described in connection with FIG. 2A. In the standby state all address lines X are connected to the same potential. This potential is, for example, 0.5 volts. The two bit lines B01 and B11 also carry the same potential which is about 0.7 volts higher than that of the address line X. The potential of the bit lines is adjusted by means of a control circuit in such a manner that the same current flows into the injecting, lateral transistors T2, T2' of all storage cells. This applies when the base-emitter voltages are of the same magnitude. If the current amplification of the inverting transistors T1 and T1' in a common emitter circuit is greater than 1, the flip-flop assumes a stable state. The standby current chosen for the cell can be very low.

For addressing the storage cell, the potential of the address line X is lowered by several 100 millivolts to 0 volts, for example. For reading there are two different modes.

In one read mode, the same potential is impressed on both bit lines, so that the two injecting, lateral transistors T2, T2' carry the same current. This current is preferably higher than that in the standby state, in order to obtain a higher speed. The non-selected storage cells connected to the same bit line pair are practically disconnected from the current supply for this purpose, since the emitter-base voltage of the corresponding lateral transistors is several 100 millivolts lower than the emitter-base voltage of the inverting flip-flop transistors T1, T1' of the selected address line X. Compared to the read time, the information of the non-selected storage cells is maintained for a long time as a result of the load stored in the flip-flop transistor capacitances. Assuming a storage state of the selected cell in which the transistor T1 is conductive and the transistor T1' is blocked or non-conductive, then, as a result of the reinjection effect, a current is fed back to the bit line B01 but not to the bit line B11. Thus, a current of different magnitude flows in the two bit lines. This current difference can be measured by means of the sense amplifier which may be in the form of a low-ohmic detector amplifier and provides an indication of the storage state of the cell.

In the second read mode, currents impressed into the bit lines rather than impressed voltages are used. In this case a voltage difference is detected on the bit lines which can be amplified by means of a connected differential amplifier and which supplies a signal indicating the storage state of the storage cell. The write operation is very simple. As in a read operation, the corresponding address line X is lowered by several 100 millivolts. To one of the two bit lines a current is applied. If, for example, the flip-flop T1 is to be made conductive, then a current is applied to bit line B01 only. A large part of this current flows into the base zone of the flip-flop transistor T1, switching this transistor on. This determines the storage state of the storage cell.

In summary, the storage cell in accordance with the invention has the following advantages. The diagrammatic structure of FIGS. 2B, 2C, and 2D indicates that the storage cell requires only a very small semiconductor area while providing increase amplification of the lateral transistors. A particular reason for this is that the structure is designed in such a manner that the smallest possible lateral dimensions which are technologically practicable are realized. All cells of a matrix with a common X address are accommodated in a stripe-shaped isolation region or row, the low-ohmic, buried zone N1+ being simultaneously used as an emitter for the flip-flop transistors and as an address line. The two flip-flop transistors, that means the two inverting transistors T1, T1' of the basic circuit in accordance with the invention, are inversely designed in a known manner. Merely as a result of the additional introduction of two extremely small zones P1 and P1' is it possible to perform all functions necessary for the current supply and for the read/write operations.

In the standby state the zones P1 and P1' act as emitters and the zones P2 and P2' as collectors. During writing, the zone P1 and P1' acts as an emitter and the zone P2 or P2' as a collector. During reading, the zone P2 or the zone P2' acts as an emitter and the zone P1 or the zone P1' as a collector. The two zones P1 and P1' are connected to the bit lines B01 and B11. Thus, only these two bit lines are necessary for wiring the storage cell in a storage matrix.

Apart from the simple operation, only very low voltage swings are necessary for operating the storage cell. This leads to the advantage that only simple peripheral circuits are necessary and that at low supply voltages an extremely favorable power/speed ratio is obtained. In spite of minimum lateral dimensions of the individual storage cells, the fact that, in accordance with the invention, the two zones P1 and P2 in the region of their edges facing each other are extended into the separating zone N+ ensures sufficiently strong read signals.

While the invention has been particularly shown and described with reference to preferred embodiments thereof, it will be understood by those skilled in the art that various changes in form and details may be made without departing from the spirit and scope of the invention.

What is claimed is:

1. A monolithically integrated semiconductor structure comprising:
   a semiconductor substrate of a first conductivity type,
   a semiconductor layer of a second conductivity type disposed on said semiconductor substrate,
   a separating zone defining a portion of said semiconductor layer having a given width between first and second sides thereof, said separating zone including a ring of heavily doped semiconductor material of said second conductivity type,
   an inverting transistor disposed within said separating zone, said transistor including a base zone of said first conductivity type and a collector zone of said second conductivity type disposed within said base zone, and
   an injection zone of said first conductivity type disposed within said separating zone and spaced from the base zone of said transistor by a given distance,
   the edge of said base zone and the edge of said injection zone facing each other extending from said first side to said second side, substantially the remaining edges of said base zone and of said injection zone being spaced from said separating zone by a predetermined distance.

2. A monolithically integrated semiconductor structure as set forth in claim 1 further including an isolation zone made of semiconductor material of said first conductivity type surrounding and contiguous to said ring of second conductivity type.

3. A monolithically integrated semiconductor structure as set forth in claim 1 further including an output terminal connected to said collector zone, means for applying a control signal to said base zone and sensing means connected to said injection zone.

4. A monolithically integrated semiconductor memory comprising:
   a semiconductor substrate of a first conductivity type,
   a semiconductor layer of a second conductivity type disposed on said semiconductor substrate,
   separating zones defining first and second portions of said semiconductor layer, each portion having a given width between first and second sides thereof, said separating zones including heavily doped semiconductor material of said second conductivity type,
   an inverting transistor disposed within each of said semiconductor layer portions, said transistor including a base zone of said first conductivity type and a collector zone of said second conductivity type disposed within said base zone,
   an injection zone of said first conductivity type disposed within each of said semiconductor layer portions and spaced from the base zone of said transistor by a given distance,
   the edge of said base zone and the edge of said injection zone facing each other within each of said layer portions extending from said first side to said second side, substantially the remaining edges of said base zones and of said injection zones being spaced from said separating zones by a predetermined distance,
   means for cross-coupling said inverting transistors to form a flip-flop circuit, and
   accessing means coupled to said injection zones and to said semiconductor layer portions.

5. A monolithically integrated semiconductor memory as set forth in claim 4 wherein said accessing means includes a pair of bit lines connected to said injection zones.

6. A monolithically integrated semiconductor memory as set forth in claim 5 wherein said accessing means further includes an address line connected to said semiconductor layer portions.

7. A monolithically integrated semiconductor memory as set forth in claim 6 wherein said address line includes a heavily doped semiconductor zone of said second conductivity type.

8. A monolithically integrated semiconductor memory as set forth in claim 4 wherein cross-coupling means includes metal conductors.

9. A monolithically integrated semiconductor memory as set forth in claim 8 wherein said accessing means includes a pair of bit lines made of metal conductors connected to said injection zones.

10. A monolithically integrated semiconductor structure comprising:
   a semiconductor substrate of a first conductivity type,
   a semiconductor layer of a second conductivity type disposed on said semiconductor substrate,
   a separating zone defining a portion of said semiconductor layer having a given width between first and second sides thereof, said separating zone including a ring of dielectric material,
   an inverting transistor disposed within said separating zone, said transistor including a base zone of said first conductivity type and a collector zone of said second conductivity type disposed within said base zone, and
   an injection zone of said first conductivity type disposed within said separating zone and spaced from the base zone of said transistor by a given distance,
   the edge of said base zone and the edge of said injection zone facing each other extending from said first side to said second side, substantially the remaining edges of said base zone and of said injection zone being spaced from said separating zone by a predetermined distance.

* * * * *